US011121516B2

(12) United States Patent
Fröhlich et al.

(10) Patent No.: US 11,121,516 B2
(45) Date of Patent: Sep. 14, 2021

(54) CRIMPING MACHINE

(71) Applicant: ZOLLER & FRÖHLICH GMBH, Wangen im Allgäu (DE)

(72) Inventors: Christoph Fröhlich, Wangen (DE); Steffen Hartinger, Wangen (DE); Hans Leupolz, Argenbühl (DE)

(73) Assignee: ZOLLER & FRÖHLICH GMBH, Wangen Im Allgäu (DE)

( * ) Notice: Subject to any disclaimer, the term of this patent is extended or adjusted under 35 U.S.C. 154(b) by 220 days.

(21) Appl. No.: 15/551,029

(22) PCT Filed: Feb. 5, 2016

(86) PCT No.: PCT/EP2016/052567
§ 371 (c)(1),
(2) Date: Aug. 14, 2017

(87) PCT Pub. No.: WO2016/128331
PCT Pub. Date: Aug. 18, 2016

(65) Prior Publication Data
US 2018/0034225 A1 Feb. 1, 2018

(30) Foreign Application Priority Data

Feb. 12, 2015 (DE) .......................... 102015102060.2

(51) Int. Cl.
*H01R 43/055* (2006.01)
*H01R 43/048* (2006.01)
(Continued)

(52) U.S. Cl.
CPC ....... *H01R 43/055* (2013.01); *H01R 43/0488* (2013.01); *H01R 43/05* (2013.01); *B23Q 3/15573* (2013.01); *H05K 13/0434* (2013.01)

(58) Field of Classification Search
CPC .............. H01R 43/055; H01R 43/0434; H01R 43/0488; H01R 43/052; H01R 43/28; B23Q 3/15573; Y10T 29/49169; Y10T 29/49208
See application file for complete search history.

(56) References Cited

U.S. PATENT DOCUMENTS 5,737,835 A * 4/1998 Murata ................. H01R 43/055
29/863
5,765,278 A * 6/1998 Koike .................. H01R 43/055
29/33 M
(Continued)

FOREIGN PATENT DOCUMENTS

DE 9308266.5 U1 8/1993
DE 4440835 C1 8/1996
(Continued)

OTHER PUBLICATIONS

Apr. 12, 2016 International Search Report issued in International Patent Application No. PCT/EP2016/052567.
(Continued)

*Primary Examiner* — A. Dexter Tugbang
(74) *Attorney, Agent, or Firm* — Oliff PLC

(57) ABSTRACT

A crimping machine having a multiplicity of magazines for contact elements which are transportable to a transfer position via a conveyor device. A component to be crimped is then brought from the transfer position into a crimping position by means of a transport device. This transport device is assigned to all of the storage arrangements.

12 Claims, 12 Drawing Sheets

(51) Int. Cl.
*H01R 43/05* (2006.01)
*B23Q 3/155* (2006.01)
*H05K 13/04* (2006.01)

(56) References Cited

U.S. PATENT DOCUMENTS

| | | | | |
|---|---|---|---|---|
| 6,067,828 A | * | 5/2000 | Bucher | H01R 43/0488 |
| | | | | 29/751 |
| 2001/0023531 A1 | * | 9/2001 | Hasegawa | H01R 43/055 |
| | | | | 29/747 |

FOREIGN PATENT DOCUMENTS

| | | |
|---|---|---|
| DE | 19714964 C1 | 7/1998 |
| DE | 19831588 A1 | 9/1999 |
| EP | 0889560 A1 | 1/1999 |
| EP | 1667289 A1 | 6/2006 |
| JP | 2005-135822 A | 5/2005 |
| JP | 2007234290 A * | 9/2007 |
| WO | 2014/181729 A1 | 11/2014 |

OTHER PUBLICATIONS

Apr. 12, 2016 International Written Opinion issued in International Patent Application No. PCT/EP2016/052567.

* cited by examiner

CRIMPING MACHINE

BACKGROUND

The invention relates to a crimping machine in accordance with the preamble of claim 1.

A crimping machine of this kind is, for instance, known from the patent document DE 44 40 835 C1 of the applicant and serves, for instance, to crimp cable end sleeves with a stripped cable end. In the known solution these cable end sleeves are rolled as a belt strap on a drum magazine and conveyed therefrom to a crimping head via a transport unit. Alternatively, the cable end sleeves and/or contact elements may also be individually accommodated in a storage and then be conveyed via an appropriate feeding device in a position-defined manner to the crimping head. A feeding device of this kind is, for instance, described in DE 198 31 588 A1.

In the known solutions the cable end sleeve to be crimped is placed on the stripped cable end by means of a holding unit and then crimped with the crimping head. The stripping of the cable end may take place either externally or by a stripping head integrated in the crimping machine.

The construction of a transport unit for conveying the cable end sleeves arranged on a belt strap or other electrical components is, for instance, described in the document G 93 08 266.5 of the applicant. A similar transport unit is also disclosed in DE 197 14 964 C1.

SUMMARY

In series production it is necessary to crimp different cable cross-sections and electrical components/contact elements with each other and to then use them in a subsequent mounting step, for instance, during the mounting of an electrical cabinet. Basically, two possibilities exist for this purpose: In one variant the crimping machine is retrofitted for crimping different cable cross-sections and/or contact elements (cable end sleeves), or else several crimping machines are provided for processing the different cable cross-sections/contact elements. The first-mentioned solution requires high set-up times and substantial personnel expenditure. This disadvantage is overcome in the last-mentioned solution with a plurality of crimping machines, but the investment costs are substantial.

As compared to this it is an object of the invention to provide a crimping machine which enables a flexible production while having a comparatively simple construction.

This object is solved by a crimping machine with the features of claim 1.

Advantageous further developments of the invention are the subject matter of the subclaims.

The crimping machine is provided for the crimping of contact elements with an end portion of a conductor, for instance, a cable end and has a storage device for the contact elements and a transport device for feeding the contact elements from the storage to a crimping head. In accordance with the invention the storage arrangement has at least two, preferably five, storages with different contact elements, wherein these storages are assigned to a common transport device for transporting the contact element from a transfer position to the crimping head.

Via an appropriate control of the transport device it is then possible to feed a contact element provided for the respective manufacturing step to the crimping head, which contact element is then crimped with the conductor adjusted with respect to the crimping head via a centering device.

A crimping machine of this kind enables an extremely flexible processing of the components without substantial investment costs or set-up times being required.

In one embodiment of the invention the transport of the contact elements from each storage to the transfer position is performed via an appropriate conveyor unit whose basic structure is, for instance, known from the afore-described state of the art. In such a variant a number of conveyor units which corresponds to the number of storages is provided for transporting the cable end sleeves to the transfer position.

In a preferred embodiment of the invention the transport unit has a shuttle for taking over the contact element being in the transfer position and for transporting it to a crimping position.

The shuttle has at least one gripper engaging on the contact element preferably transversely to the longitudinal axis of the contact element. This gripper may then grip the contact element being in the transfer position and convey it to the crimping head.

For shortening the production time the shuttle may be designed with two grippers arranged in parallel, wherein one gripper takes over the contact element being in the transfer position and the second gripper grips a contact element to the crimped in a subsequent operation. In this manner it is, for instance, possible to crimp both end portions of a cable end with corresponding contact elements with a minimum of production effort, wherein these contact elements may be different.

In one variant of the shuttle the grippers are movable along a guide such that the grippers are movable in one plane from the transfer position to the crimping position. This is preferably a vertical plane with respect to the footprint of the crimping machine.

The construction of the crimping machine is especially simple if the contact elements are each arranged as a belt strap on a drum magazine. Such drum magazines are very easy to be exchanged, so that the set-up times are further reduced. Furthermore, the position orientation predetermined by the belt strap facilitates the subsequent processing of the contact elements.

It is to be understood that alternatively individual elements may also be crimped, wherein, however, the effort for a correct positioning of the individual contact elements has to be taken into account.

In the case in which the contact elements are provided as a belt strap, a cutting device may be provided for separating the contact element being in the transfer position from the belt strap.

In one embodiment a cutting device of this kind has a number of cutting knives corresponding to the number of storages, wherein, however, merely the one cutting knife gets into operation which is assigned to the contact element being in the transfer position.

In one embodiment the centering device for centering the conductor with respect to the crimping position has a plurality of centering apertures. By moving this centering guide it is possible to orientate the centering aperture which is assigned to the conductor cross-section to be processed with respect to the crimping position.

In one embodiment the centering device has two centering jaws which are adapted to be moved apart for removing the crimped product.

A very compact construction of the crimping machine can be implemented if the respective transfer positions of the transport units are arranged on top of each other, so that the gripper is movable between the transport planes and the separating device is movable transversely thereto, i.e. in parallel to the axis of the crimping head and/or the centering device.

The operating safety of the crimping machine can be improved if it is provided with a cover and comprises a safety circuit interrupting the energy supply in the case of undesired opening of the cover. In order to facilitate the set-up of the crimping machine, it is designed with a set-up circuit enabling the function of the crimping machine with the protective hood opened.

The degree of automation can be increased if the feeding of the contact elements is performed through a suitable feeding unit, for instance, a handling device or the like.

By a suitable design of the control unit of the crimping machine the transport unit can be controlled such that it takes over a particular contact element being in a transfer position and transports it to the crimping position.

The crimping machine is preferably programmed via a control panel. For improving ease of use, this control panel may be mounted removably on a housing of the crimping machine.

BRIEF DESCRIPTION OF THE DRAWINGS

A preferred embodiment of the invention will be explained in more detail in the following by means of schematic drawings. There show.

DETAILED DESCRIPTION

Figure 1:
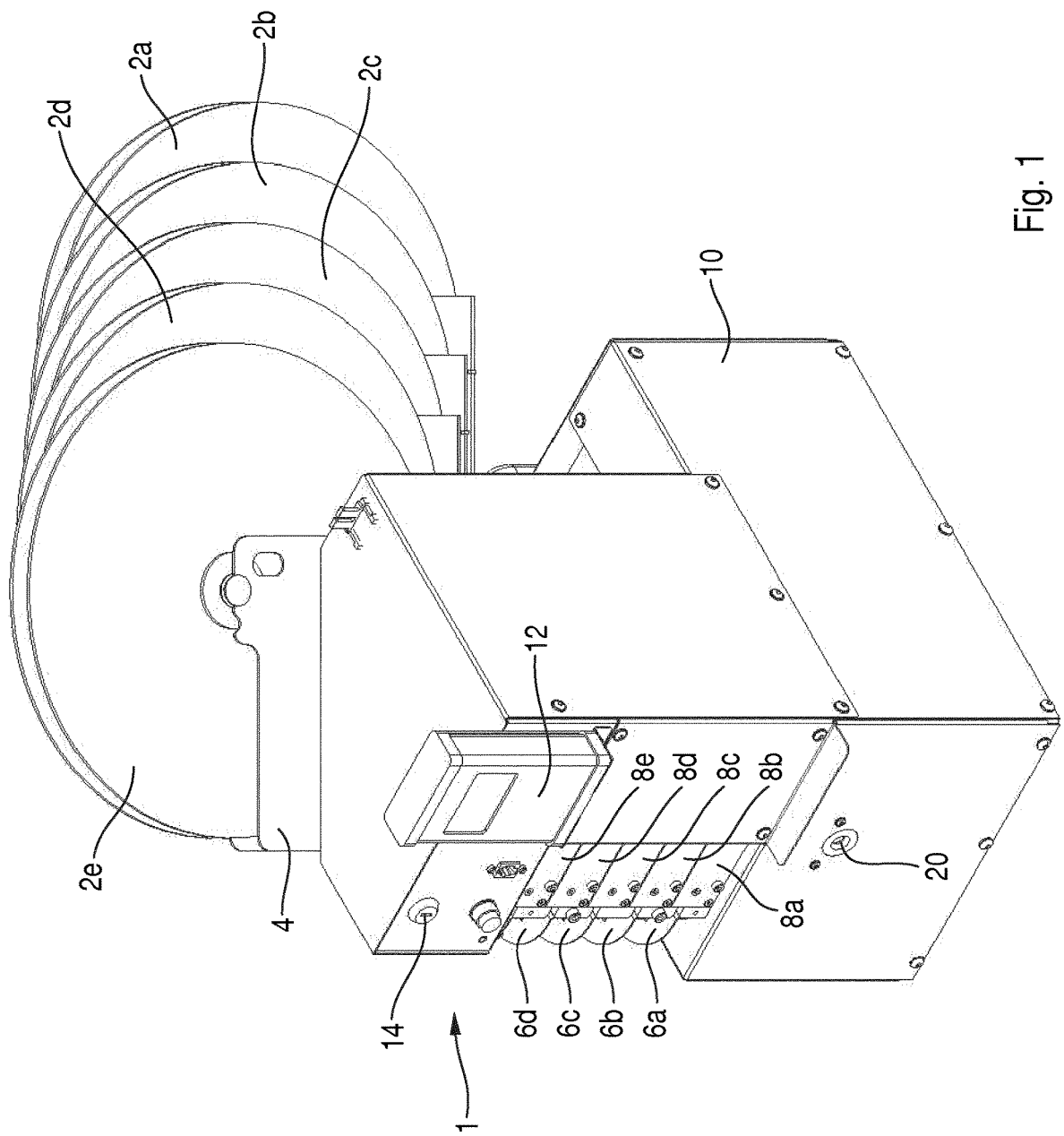
FIG. 1 a three-dimensional front view of a crimping machine in accordance with the invention.

FIG. 1 shows a three-dimensional front view of a crimping machine 1 which is adapted to process five different cable end sleeves or other contact elements. In the embodiment described in the following the crimping machine 1 is described for the processing of cable end sleeves for different cable cross-sections. The cable end sleeves are provided as belt straps. These belt straps are wound on a total of five drum magazines 2a, 2b, 2c, 2d, and 2 e and are rotatably mounted on a magazine holder 4 of the crimping machine. In accordance with the illustration in FIG. 2, which shows the crimping machine 1 in a view from the left in FIG. 1, in extension of the circumferential portions of the drum magazines 2a to 2e which are positioned at the bottom in the view according to FIG. 2, guideways 6a, 6b, 6c, 6d, and 6e are formed whose end portions end in a respective conveyor unit 8a, 8b, 8c, 8d, and 8e. Over those the belt strap (not illustrated) is unwound from the drum magazines 2 and, depending on the controlling of the crimping machine, the cable end sleeve of a predetermined belt strap is transported to a transfer position which will be explained in detail in the following. As results from the illustration in FIG. 2, the transport units 8a, 8b, 8c, 8d, 8e are arranged on top of each other in the vertical direction, so that correspondingly also the associated guideways 6a, 6b, 6c, 6d, 6e end in these super-imposed planes. The magazine holder 4, the guideways 6 mentioned, and the conveyor units 8 are mounted on a frame of the crimping machine.

The other functional elements of the crimping machine 1 are enclosed by a multi-part housing 10. The programming and input of the production parameters for the control unit which is also accommodated in the housing 10 is performed via a control panel 12 which is either integrated in the housing 10 or—as in the instant case—is mounted removably on the housing 10. The illustration according to FIGS. 1 and 2 further reveals a lock 14 for switching the crimping machine 1 on and off and for adjusting a set-up mode which enables the actuation of the crimping machine 1 even if a cover 16—which is indicated in dots and dashes and which is required for operating safety—is opened. In normal operation the energy and equipment supply of the crimping machine is interrupted for safety reasons if the cover 16 is opened. For adjusting/retrofitting the afore-described set-up mode may then be set, which enables an operation of the crimping machine 1 even with an open cover. This readjustment can, however, only be made by a certain group of people.

Figure 2:
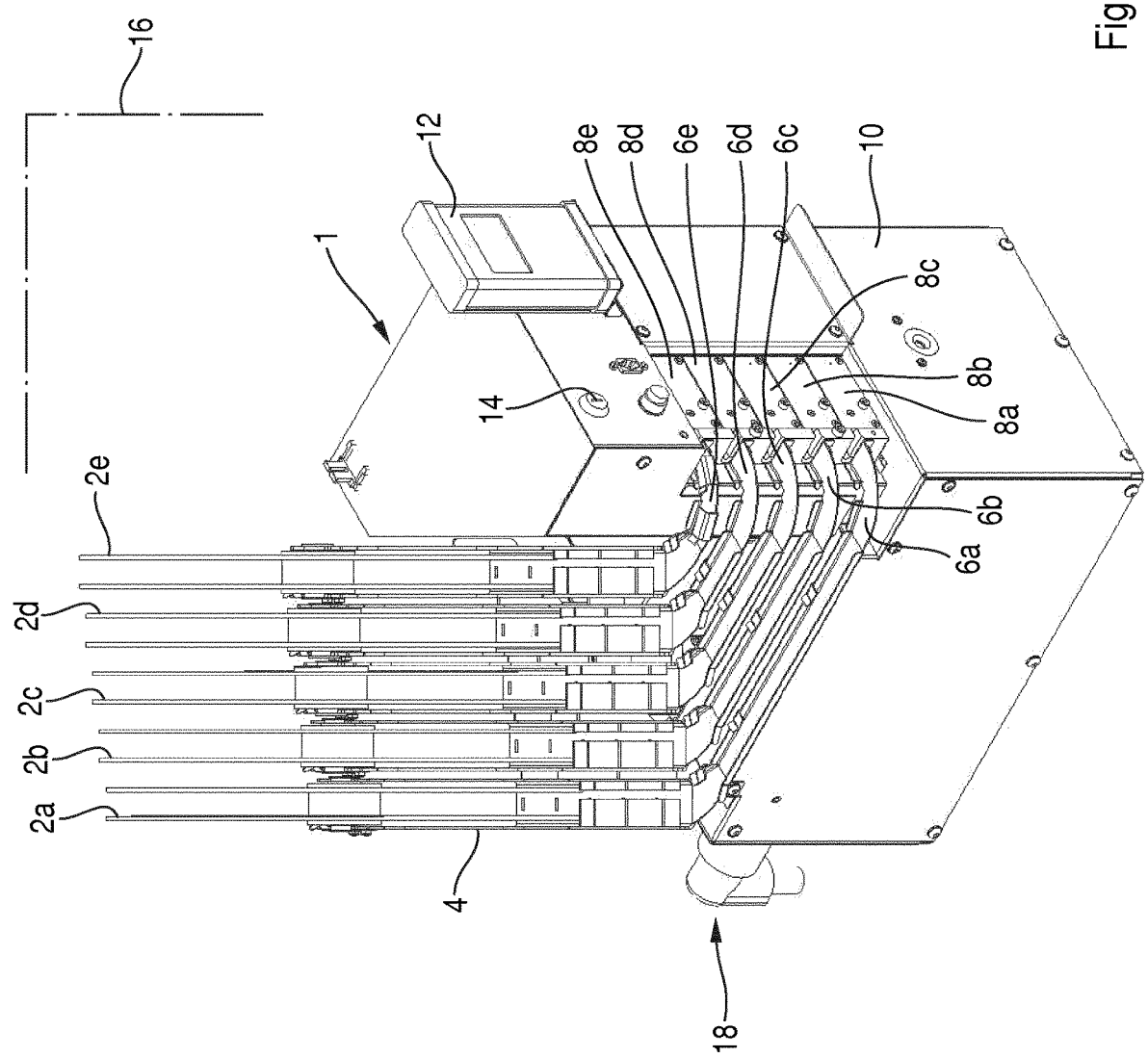
FIG. 2 a side view of the crimping machine according to FIG. 1.

As is indicated in FIG. 2, energy and equipment supply connections 18 are formed at the rear side of the crimping machine 1 which faces away from the control panel 12. The components of the crimping machine 1 which are described in the following are either driven by an electric motor or pneumatically, so that correspondingly the power supply and the compressed air supply are connected at the rear side of the crimping machine 1.

In the three-dimensional illustrations according to FIGS. 3 and 4 parts of the housing 10 have been removed, so that some functional elements of the crimping machine 1 which will be explained in detail in the following are visible. These functional elements are mounted directly or indirectly on a base plate 19 of the housing 10. The afore-described connections 18 for power, compressed air, and for input and output signals for the operation in a production line in which the crimping machine 1 is integrated are visible in FIG. 4.

At the front side of the housing 10 which is visible in FIG. 1, an inlet opening 20 is provided for the cable end which is to be crimped with the cable end sleeve being in the transfer position.

Figure 5:
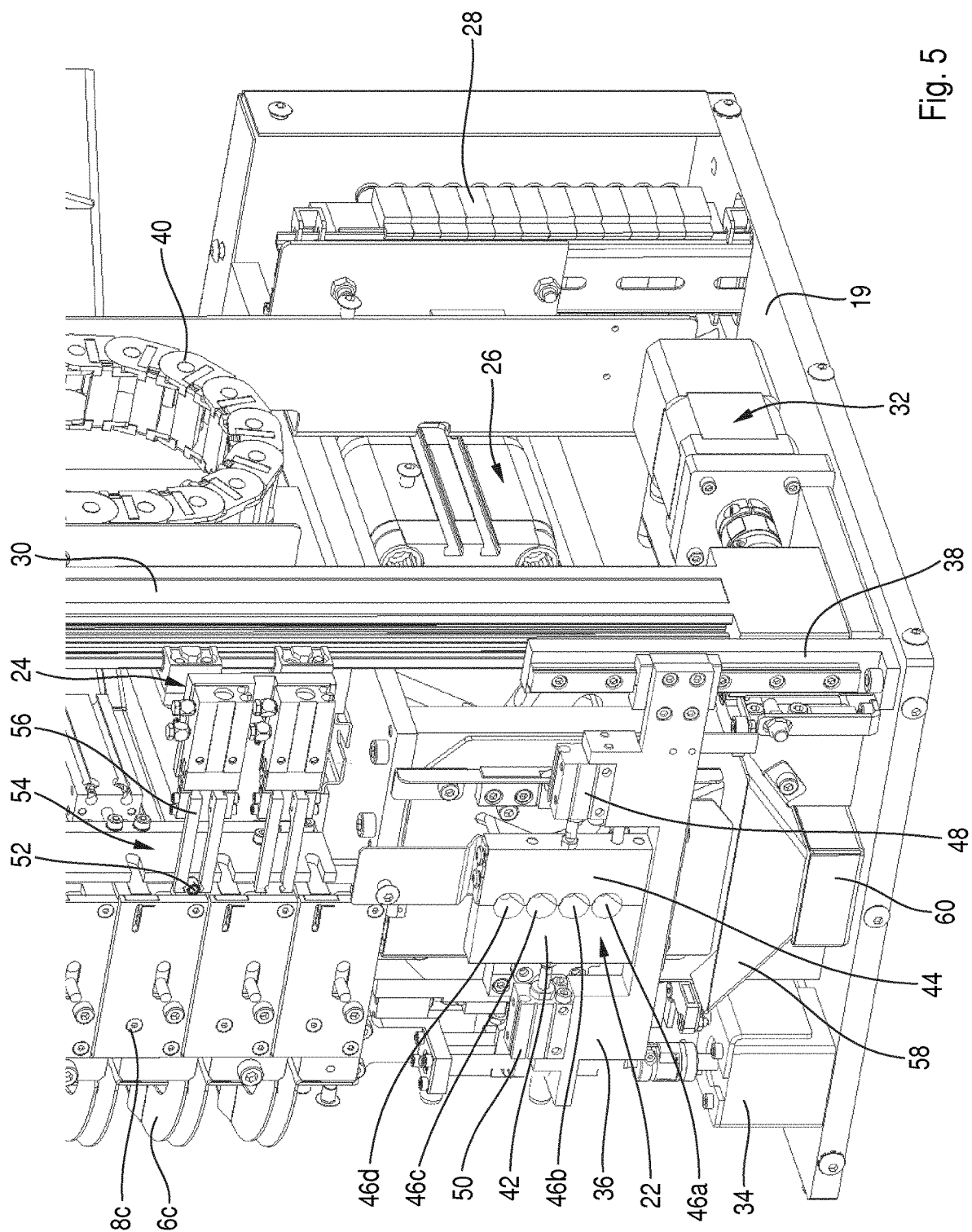
FIG. 5 an enlarged detailed representation of the view according to FIG. 3.

With the housing cover removed, the centering device 22 positioned behind the inlet opening 20 becomes visible which, as will be explained later by means of FIG. 5, is movable in the vertical direction (view according to FIG. 3), so that it may be positioned with respect to a crimping position. This centering device 22 serves to center the fed cable end with respect to this crimping position.

As explained before, via the conveyor units 8a to 8e, by an appropriate controlling of the control unit (not illustrated), a particular cable end sleeve is taken to a transfer position and then separated from the belt strap by means of a cutting knife which will be explained in more detail in the following. The corresponding cable end sleeve is held by a shuttle 24 and then moved in the vertical direction to the crimping position. As explained, the centering device 22 is adjusted with respect to this crimping position such that the stripped cable end may be introduced into the cable end sleeve held by the shuttle 24 or by another gripper. In a following operation a crimping head 26 is then controlled to crimp the cable end sleeve and the cable end with one another. As explained initially, the feeding of the stripped cable end is performed in a production line via a suitable handling device. Stripping may be performed in an upstream process step. Basically, however, a stripping head may also be integrated in the crimping machine. Such stripping head is, for instance, illustrated in the initially described DE 44 40 835 C1.

Figure 3:
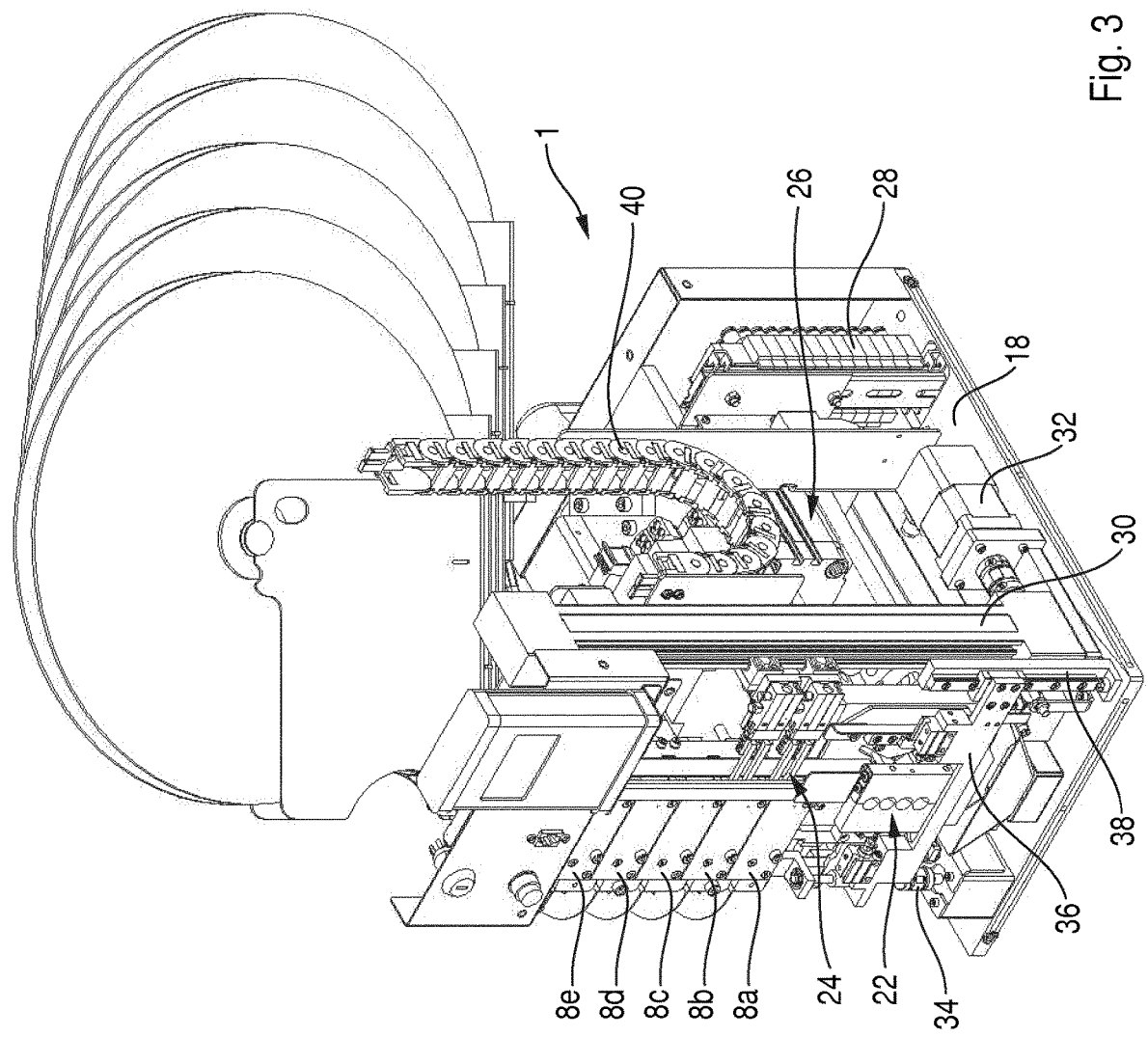
FIG. 3 the crimping machine in the view of FIG. 1 with removed housing elements.
Figure 4:
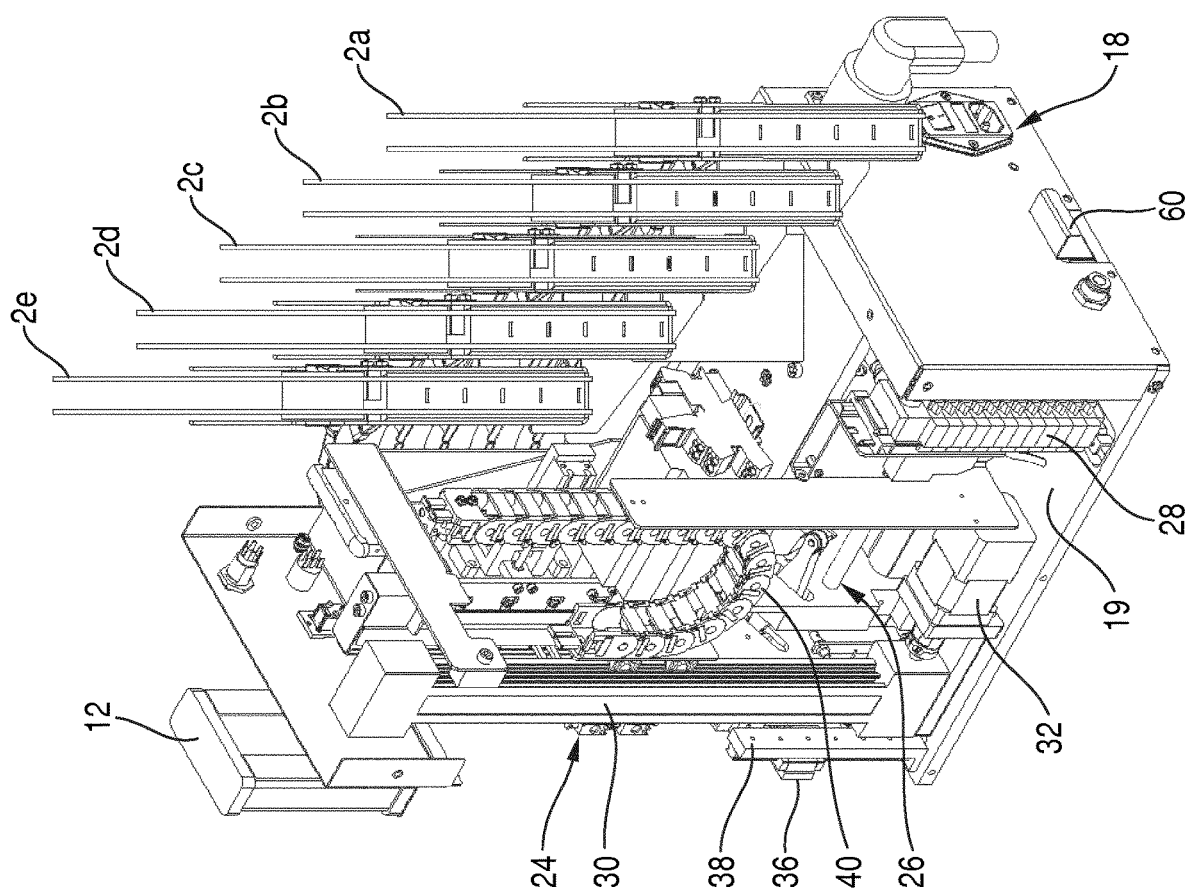
FIG. 4 the crimping machine in a rear view with removed housing elements.

In the views according to FIGS. 3 and 4, connection terminals 28 for the power supply of the electrically operated components are visible. In accordance with FIGS. 3 and 4 the shuttle 24 is mounted on a guide pillar 30 and movable in the vertical direction by means of an electromotive shuttle drive 32 so as to be able to take over the respective cable end sleeve which has been taken to its transfer position.

The height adjustment of the centering device 22 is also performed electromotively by a centering drive 34, wherein the actual centering device 22 is mounted on a console 36. It is movable along a vertical guide 38. This means, both the shuttle 24 and the centering device 22 are movable in the vertical direction in parallel to each other. The compressed air supply of the shuttle 24 is performed via compressed air hoses which are guided in a link chain 40 whose end portion travels along with the shuttle 24.

FIG. 5 shows a detailed illustration of the crimping machine 1 in a view corresponding to FIG. 3, from which the basic structure of the centering device 22 results. As explained, the console 36 is movable in the vertical direction along the vertical guide 38 by controlling the centering drive 34. The centering drive 34 is designed as an electromotive drive whose drive screw engages on the console 36 for adjusting same. Two centering jaws 42, 44 are guided on the console to be movable in the horizontal direction, said centering jaws confining, in the illustrated closed state, four centering apertures 46a, 46b, 46c, 46d which are each assigned to different cable cross-sections and/or cable end sleeve diameters.

The centering apertures 46c, 46 positioned at the top in FIG. 5 are, for instance, provided for the crimping of cables with a diameter of 2.5 mm and/or 1.5 mm. The centering aperture 46b positioned therebelow is provided for cable cross-sections with 1.0 mm and the lowermost centering aperture 46a for cable cross-sections with 0.5 mm and 0.75 mm. This means that for the comparatively small cross-sections one single common centering aperture 46a is sufficient. These diameter indications are merely of exemplary nature. In the case of such an allocation, suitable cable end sleeves for these diameters (0.5 mm, 0.75 mm, 1.0 mm, 1.5 mm, 2.5 mm) would then be provided correspondingly on the five drum magazines 2a to 2e. The opening and closing of the two centering jaws 42, 44 is performed via pneumatic or electromotive closing drives 48, 50 which are mounted on the console 36 and engage on respective centering jaws 42, 44 with their operating elements.

The controlling of the centering device 22 is performed such that, depending on the cable end sleeve taken to the crimping position, the correspondingly provided centering aperture is adjusted with respect to the crimping position. For facilitating the centering process these centering apertures 46 are butted toward the crimping head 26, so that the introducing of the cable end is facilitated.

In the illustration according to FIG. 5 a cable end sleeve 52 being in a transfer position is visible, which is, in accordance with the predetermined designs, provided for a medium cable diameter of 1.0 mm. This cable end sleeve 52 is conveyed to the illustrated transfer position by the aforedescribed middle conveyor unit 8c and is then separated from the belt strap which is guided along the associated guideway, in the instant case the guideway 6c, by means of a cutting device 54. During the separation the cable end sleeve 52 is held by a gripper 56 of the shuttle 24 movable at the guide pillar 30. After the separation the shuttle 24 then moves downward to the crimping position, so that the cable end may be fed through the correspondingly positioned centering aperture 46b.

In accordance with FIG. 5 a collecting funnel 58 is arranged on the base plate 19 below the centering device 22, into which residues of the belt strap or defectively crimped cable end sleeves or the like drop. These parts drop into a collecting container 60 which may, as can be seen in FIG. 4, be pulled out from the rear wall for being emptied.

Figure 6:
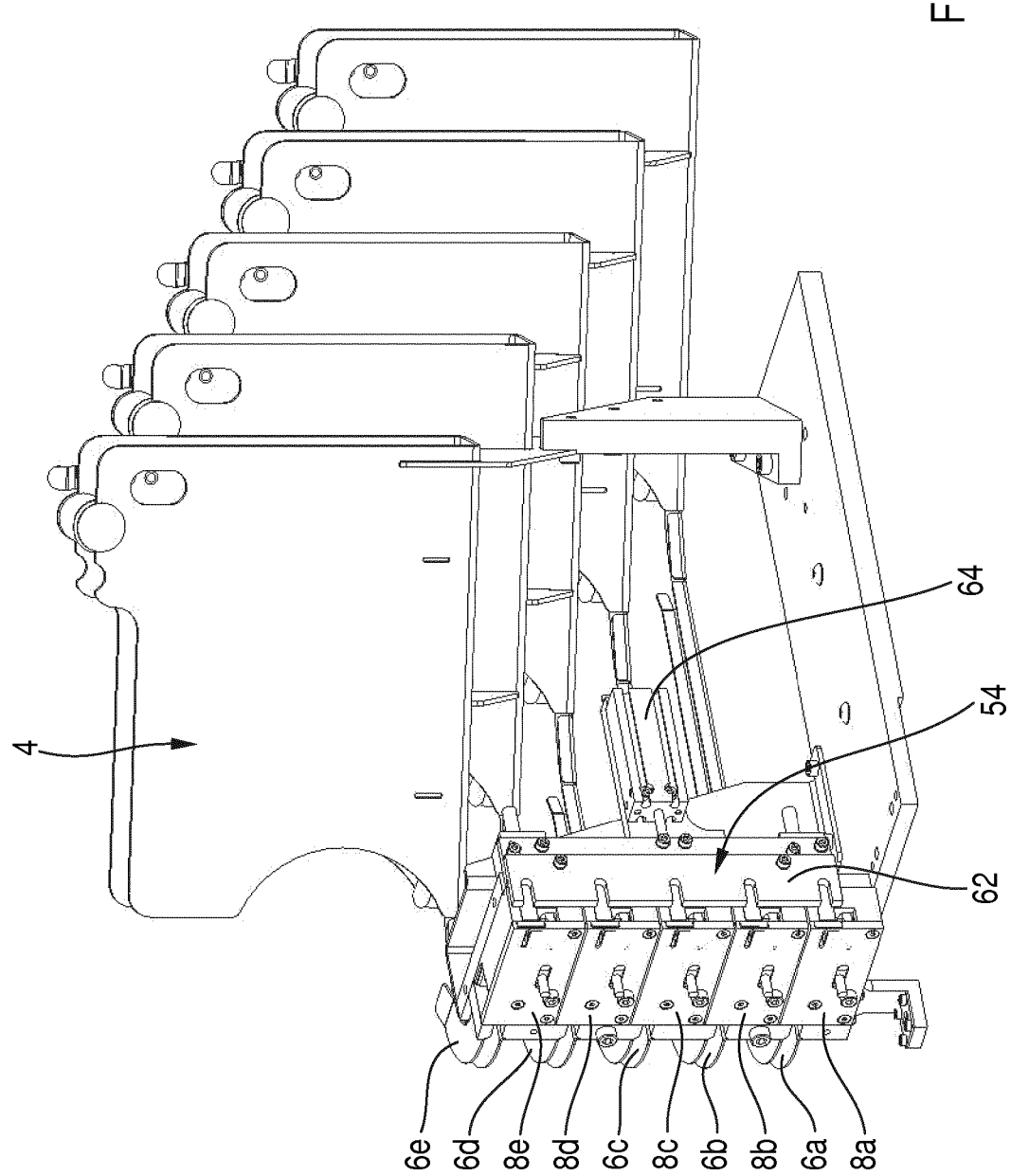
FIG. 6 an individual view of a conveyor unit of the crimping machine according to FIGS. 1 to 5.

The function of the cutting device 44 is explained by means of FIG. 6 which merely illustrates the conveyor units 8a to 8e, parts of the associated guideways 6a to 6e, and the cutting device 54. The latter has a cutting beam 62 which is adjustable in the horizontal direction by means of a pneumatic cylinder 64 so as to separate the cable end sleeve 52 being in the transfer position from the associated belt strap. Accordingly, the pneumatic cylinder 64 is arranged in the adjustment direction, i.e. in the horizontal direction.

Figure 7:
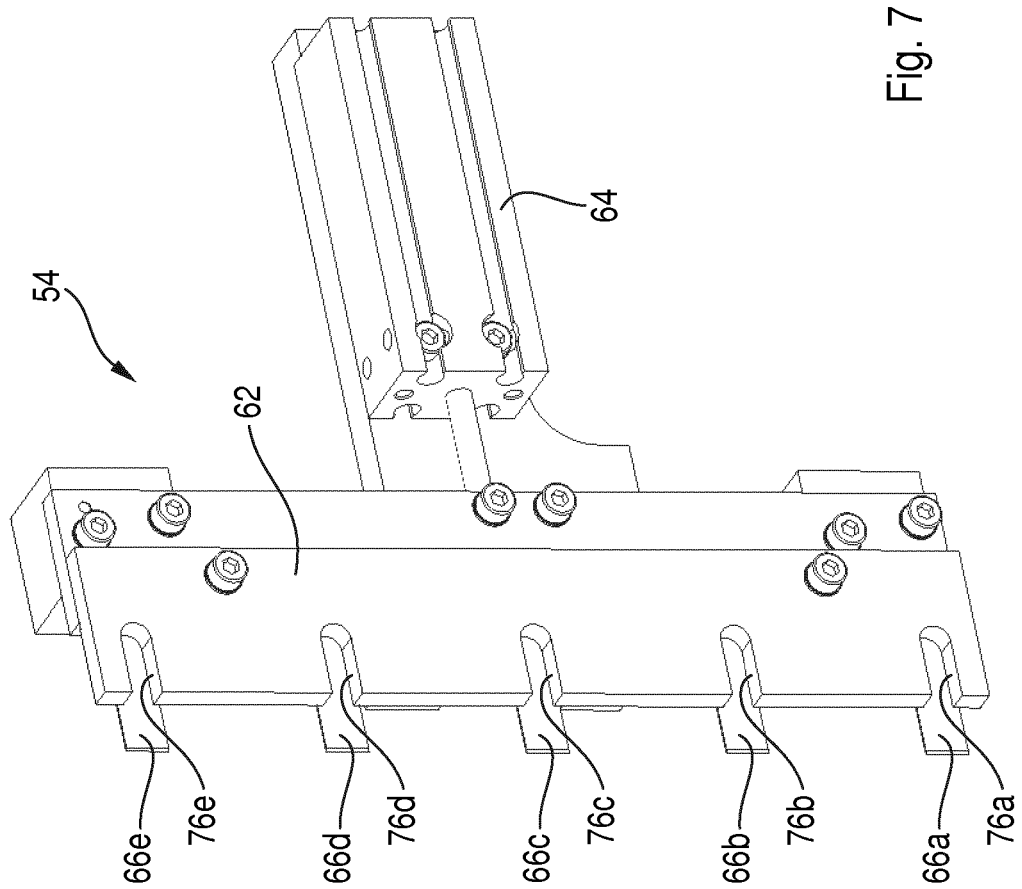
FIG. 7 an individual illustration of a cutting device of the crimping machine.

FIG. 7 shows an individual illustration of the cutting device 54 with the cutting beam 62 actuated by the pneumatic cylinder 64, on which a total of five cutting knives 66a, 66b, 66c, 66d, 66e are fastened whose axial distance corresponds to the transfer positions of the respective conveyor units 8a to 8e.

Figure 8:
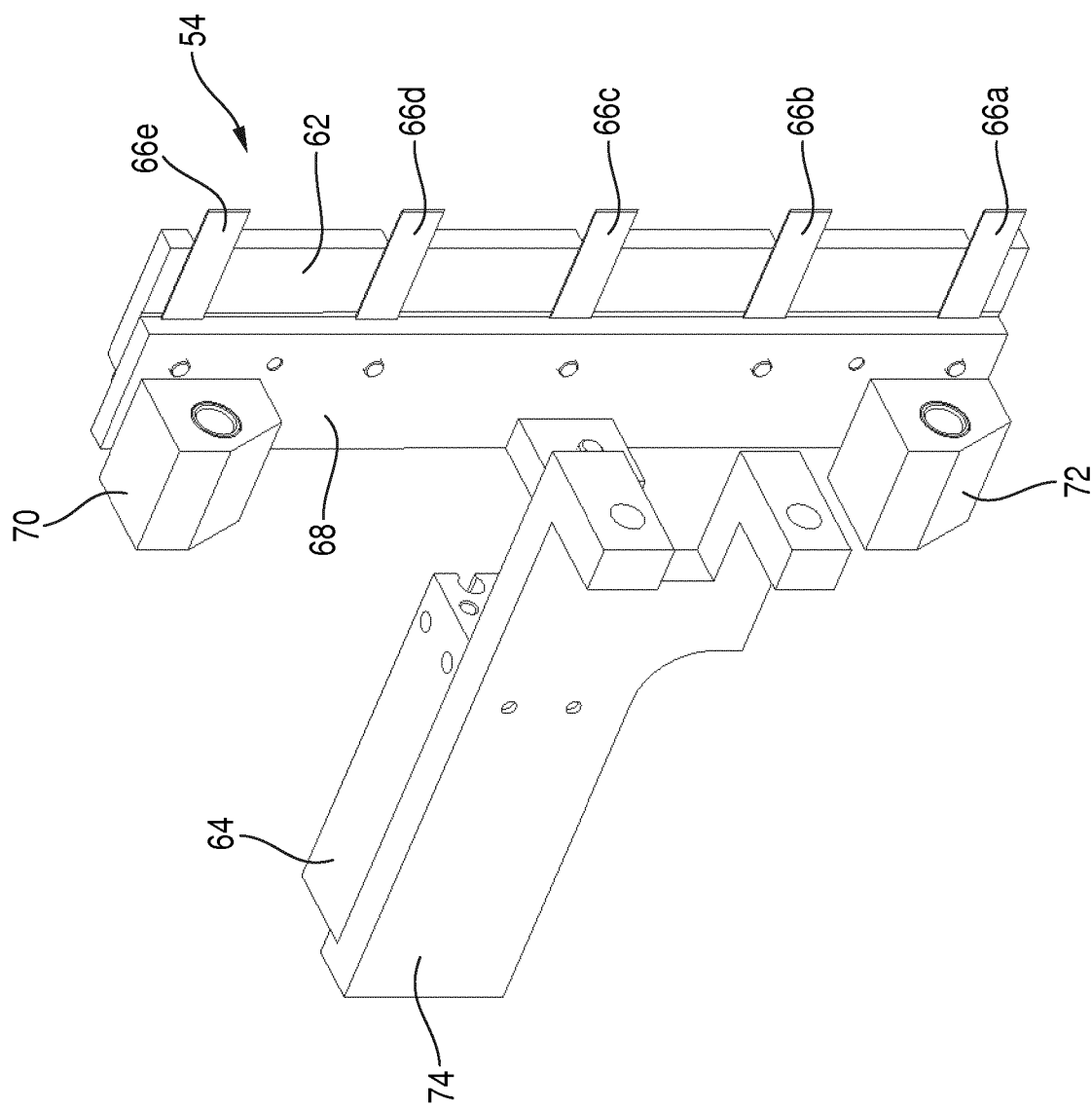
FIG. 8 a rear view of the cutting device according to FIG. 7.

FIG. 8 illustrates the cutting device 54 from the rear (with respect to the view in FIG. 7). Accordingly, the cutting beam 62 is held with the knives 66a to 66e on a knife plate 68 on which two guide blocks 70, 72 are also fastened which are interspersed with guide elements of the crimping machine, so that the cutting knives 66a to 66e are exactly guided in the horizontal direction. The pneumatic cylinder 64 is fastened to a support console 74 which is fixedly secured to the housing. In accordance with the illustration in FIG. 7, long holes 76a, 76b, 76c, 76d, and 76e are formed on the cutting beam 62 in the region of the knives 66a to 66e.

As may be taken from the illustration according to FIG. 5, the grippers, when holding the cable end sleeve 52, immerse into the space between two adjacent cutting knives 66a to 66e projecting over the long holes 76.

Details of the shuttle will be explained by means of FIGS. 9 and 10.

Figure 9:
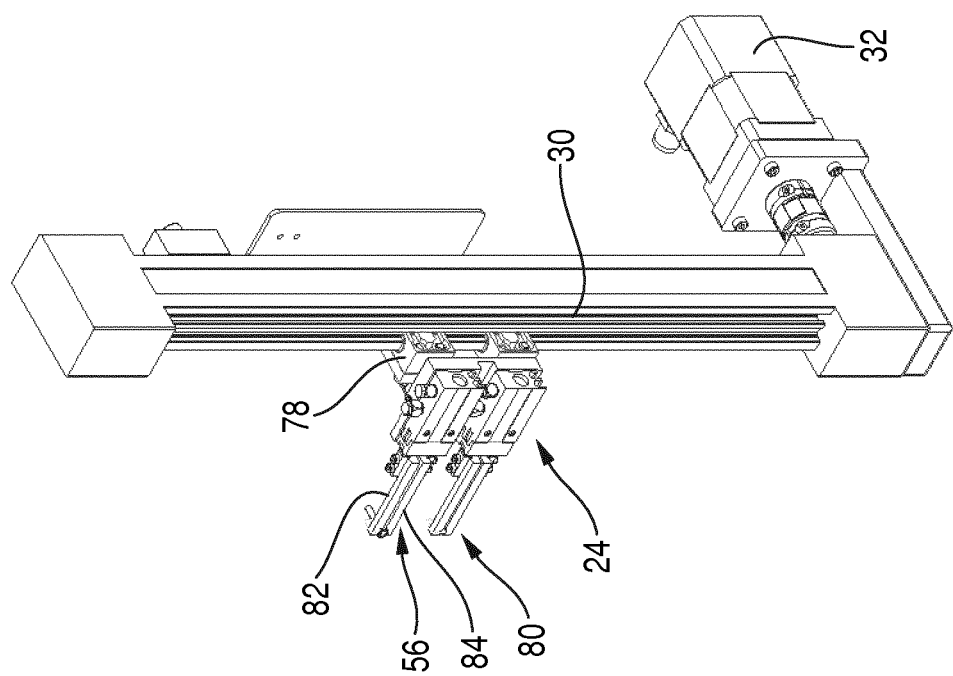
FIG. 9 a shuttle of the crimping machine.

FIG. 9 shows an individual illustration of the shuttle 24 with the associated guide elements. As explained, the shuttle 24 is guided to be moved with a shuttle carriage 78 along the guide pillar 30 in the vertical direction. The drive is performed electromotively by the shuttle drive 32 whose drive axis is staggered by 90° relative to the vertical axis, so that a corresponding deflection in the drive train is necessary to move with the carriage 78. In the illustrated embodiment the carriage 78 carries two super-imposed (view according to FIG. 9) grippers 56, 80, each having two gripper arms 82, 84 (see FIG. 10). These gripper arms 82, 84 have at their end portion two respective gripper recesses 86, 88 which are adapted to the contour of the contact elements to be processed, in the instant case the cable end sleeves, so that all sizes can be gripped reliably. For taking up the cable end sleeve 52 the gripper arms 82, 84 may be moved apart in the direction of the arrow, i.e. in the vertical direction. This moving apart is performed pneumatically via a respective gripper cylinder 90, 92 which controls the opening and closing movement of the gripper arms 82, 84. The compressed air supply of the gripper cylinders 90, 92 is performed via the link chain 40. The corresponding connection elements are illustrated in FIG. 10.

The gripper arms 82, 84 may be moved like scissors or in parallel to each other to receive the cable end sleeve 52.

Figure 10:
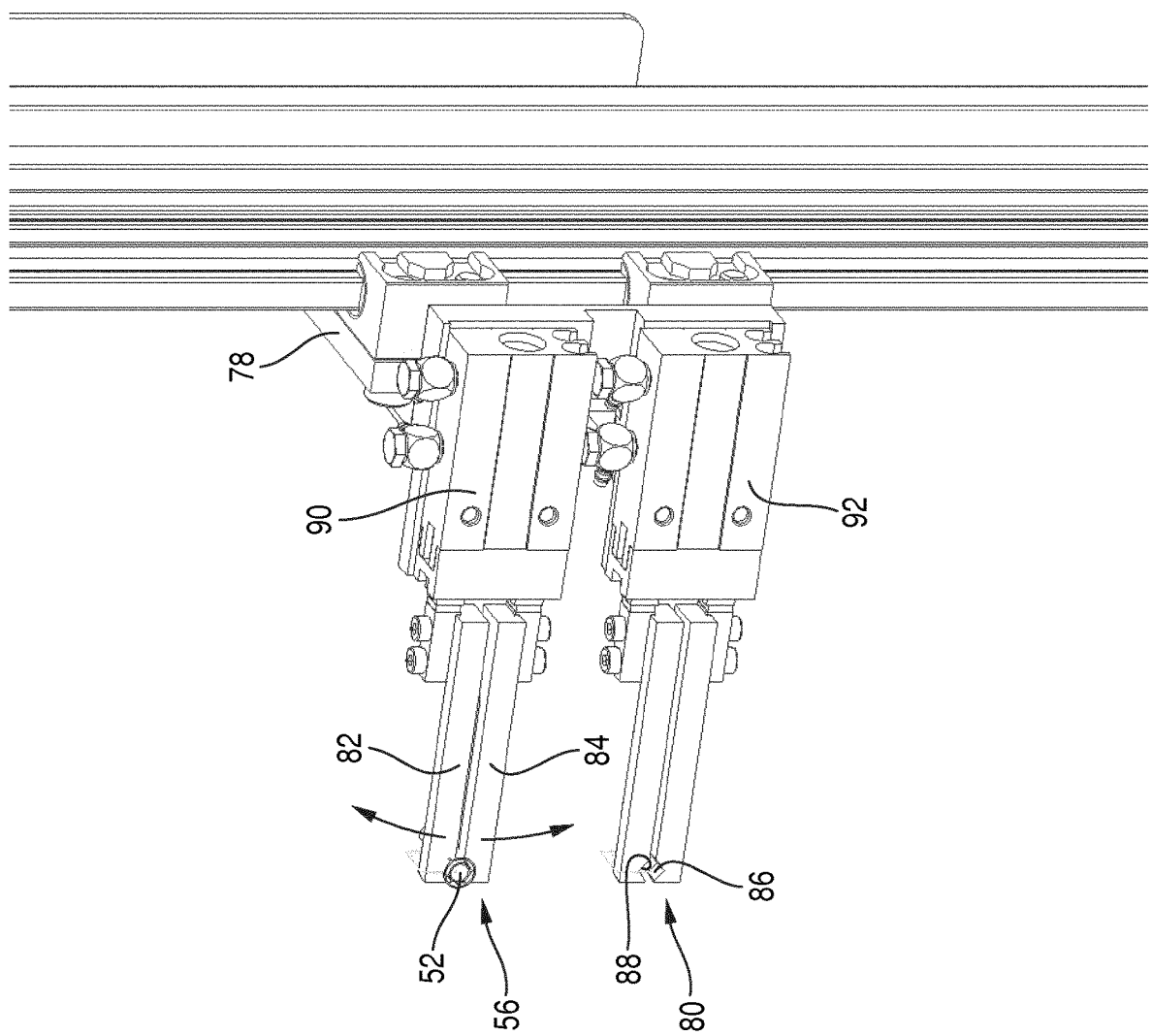
FIG. 10 a detail illustration of the shuttle according to FIG. 9.

The second gripper 80 illustrated in FIGS. 9 and 10 may, for instance, be used to take over a further cable end sleeve or another contact element which may indeed have a cross-section differing from that of the cable end sleeve 52, so as to, after the crimping of the cable end sleeve 52 with one end of the cable, place the cable end sleeve or the other contact element taken by the gripper 80 on the other end of this cable.

Figure 11:
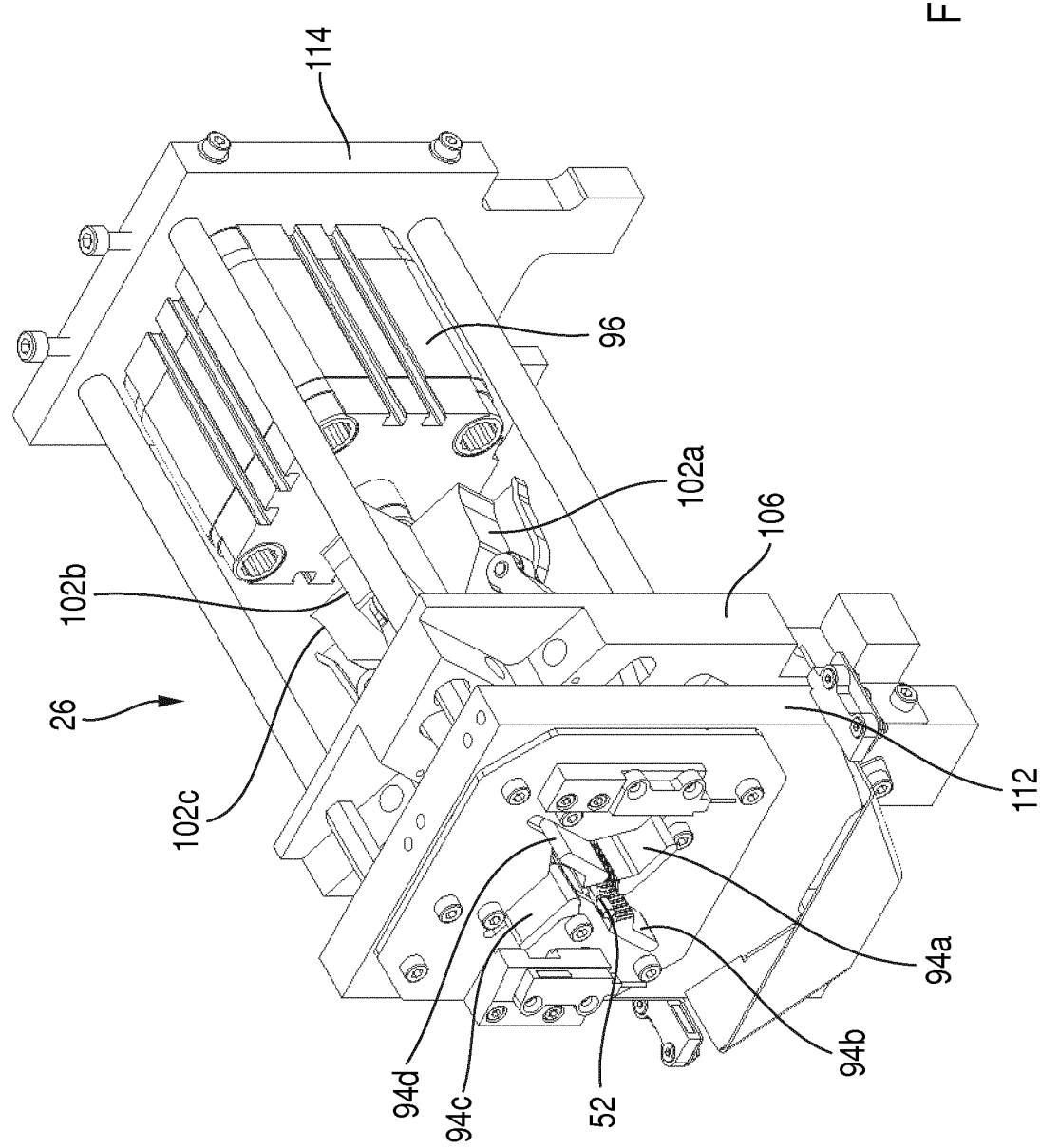
FIG. 11 an individual illustration of the crimping head of the crimping machine.
Figure 12:
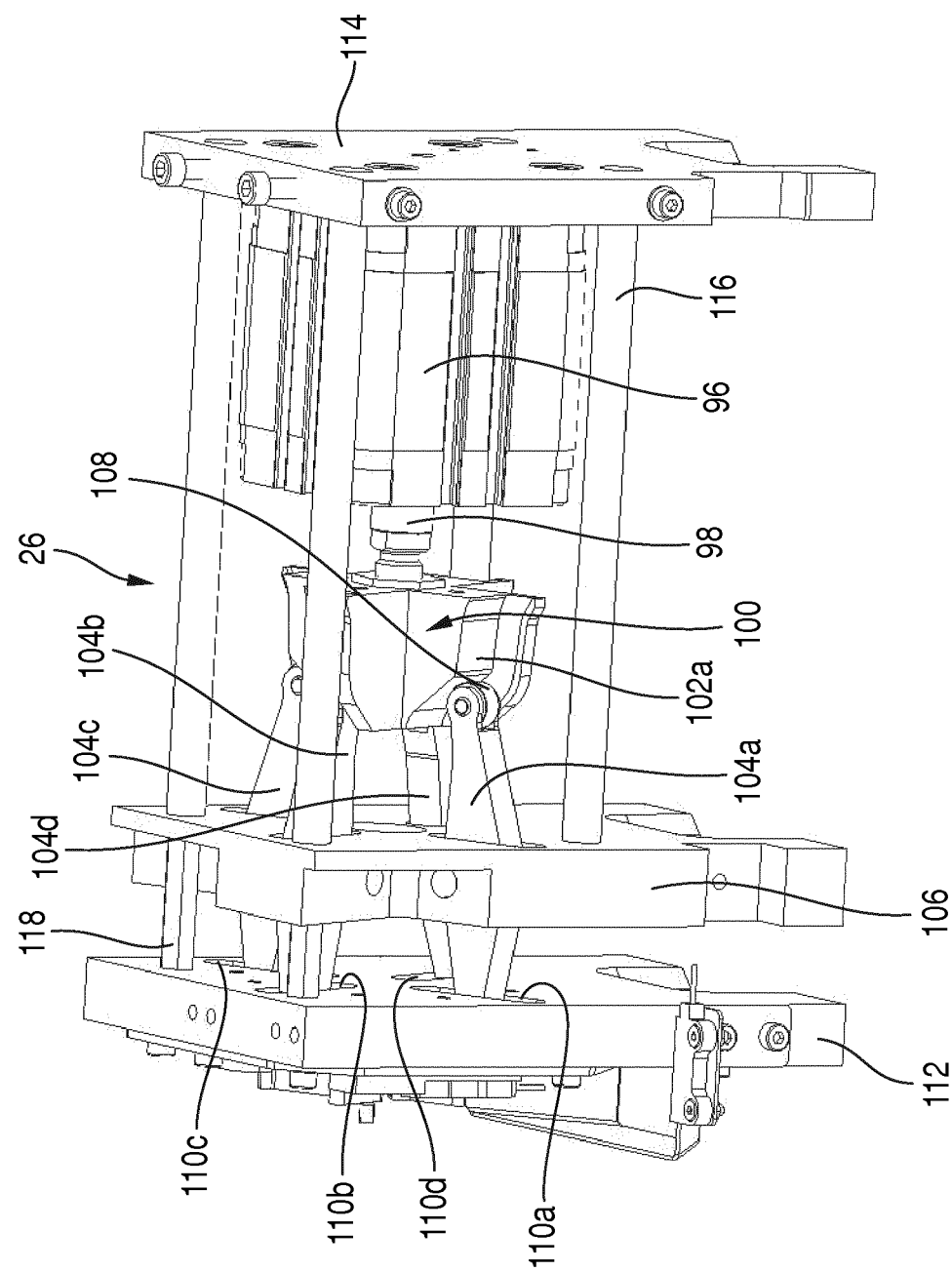
FIG. 12 a side view of the crimping head according to FIG. 11.

Crimping takes place by the crimping head 26 shown in an individual illustration in FIGS. 11 and 12. The crimping head 26 has four crimping jaws 94a, 94b, 94c, and 94d which are displaced by approx. 90° with respect to each other and which are illustrated in their open position in FIG. 11. The cable end sleeve 52 to be crimped is moved to the illustrated crimping position by the shuttle 24. The respective gripper 56 holds the cable end sleeve 52 on its plastic collar while the four crimping jaws 94a to 94d engage at a small tube connected with the plastic collar. The stripped cable end is introduced in the cable end sleeve 52 via the centering device 22 or more exactly via the centering aperture which has been moved to the correct relative position, and subsequently the crimping head 26 is controlled such that the four crimping jaws 94a to 94d move inwardly in the radial direction and initiate the deformation process. The crimping force is applied through a crimping cylinder 96 which is preferably actuated by an electric motor. A link body 100, at which a total of four links 102 is formed in the same division as the crimping jaws 94, is guided on a crimping piston 98 of the crimping cylinder 96. In the illustration according to FIG. 12 only one link 102a is visible. In the illustration according to FIG. 11 two further links 102b, 102c can be seen apart from the link 102a. A fourth link is oriented downward in the illustrations according to FIGS. 11 and 12 and is not visible.

During the extending of the crimping piston 98 crimping levers 104a, 104b, 104c, 104d are pivoted via the links 102 so as to adjust the crimping jaws 94a to 94d. These crimping levers 104 are pivotably mounted in a plate 106 and each rest with their end portion via a roll 108 on the associated link 102. The other end portion of the crimping lever 104 pierces inclined slots 110a, 110b, 110c, and/or 110d of a front plate 112, wherein the crimping jaws 94a to 94d are formed at the end portions projecting from the front plate 112 in the view according to FIG. 11. The inclined slots 110a to 110d enable the radial adjustment of the crimping jaws 94a to 94d.

As may be taken from FIGS. 11 and 12, the axial distance of the links 102 increases from the axis of the crimping piston 98 toward the crimping cylinder 96. When the crimping piston 98 extends, the crimping levers 104 are pivoted with increasing lift via the rolls 108 rolling on the respective link 102, wherein the link body-side end portion of the crimping levers 104 is pivoted in the radial direction to the outside and correspondingly the crimp jaw-side end portion pivots to the inside and thus causes the plastic deformation of the cable end sleeve. This pivoting to the inside is enabled by the canted inclined slots 110 in the front plate 112. After the crimping process the crimping piston 98 retracts again, so that the crimping jaws 94 correspondingly move apart and the crimped unit may be taken by a suitable handling device or the like and is supplied to a further processing step.

The lift of the crimping cylinder 96 may optionally depend on the cross-section of the components to be processed.

The entire crimping unit is supported on the base plate 19 of the housing by a rear support plate 114, the plate 106, and the crimping plate 112. The two plates 106, 114 are connected with each other by tension struts 116. A plurality of connection bolts 118 extend between the plate 106 and the crimping plate 112.

The crimping machine 1 in accordance with the invention is designed such that any cross-section to be processed may be fed over any drum magazine 2 and any associated conveyor unit 8 and/or guideway 6.

By a corresponding programming of the control unit via the control panel 12 a predetermined sequence may be set by which different cable end sleeves/contact elements may be assembled with different cables. This, however, necessitates that the cables to be processed are fed in the predetermined order automatically or manually.

Depending on the production task given by the control panel 12, the centering device 22 is, via the centering drive 34, adjusted with the associated inlet opening 20 with respect to the crimping position, i.e. to the axis of the crimping head 16. Simultaneously, the corresponding belt strap is, via the conveyor unit 8 which is assigned to the contact element to be crimped, moved by one step in the direction to the transfer position, so that the cable end sleeve 52 arranged at the end is arranged in this transfer position. Then, the gripper 56 is, via the shuttle drive 32, moved to the transfer position, and the cable end sleeve is held along the gripper recesses 86, 88 by the controlling of the gripper cylinders 90, 92. After this fixing of the cable end sleeve 52 the cutting device 54 performs with the knife plate 68 a horizontal lift toward the belt strap, wherein merely the cutting knife 66 assigned to the corresponding cable end sleeve gets into operation. After the separating of the cable end sleeve from the belt strap it is moved by the shuttle to the crimping position between the crimping jaws 94, and then the stripped cable end is introduced through the inlet opening 20. The introduction may be detected by a sensor, so that after the introduction the crimping head 26 is actuated in the afore-described manner to crimp the cable end sleeve with the cable end.

Disclosed is a crimping machine having a multiplicity of magazines for contact elements which are transportable to a transfer position via a conveyor device. A component to be crimped is then brought from the transfer position into a crimping position by means of a transport device. This transport device is assigned to all of the storage arrangements.

LIST OF REFERENCE NUMBERS 1 crimping machine
2 drum magazine
4 magazine holder
6 guideway
8 conveyor unit
10 housing
12 control panel
14 lock
16 cover
18 connection
19 base plate 20 inlet opening
22 centering device
24 shuttle
26 crimping head
28 connection terminals
30 guide pillar
32 shuttle drive
34 centering drive
36 console
38 vertical guide
40 link chain
42 centering jaws
44 centering jaws
46 centering aperture
48 closing drive
50 closing drive
52 cable end sleeve
54 cutting device
56 gripper
58 collecting funnel
60 collecting container
62 cutting beam
64 pneumatic cylinder
66 cutting knife
68 knife plate
70 guide block
72 guide block
74 support console
76 long hole
78 carriage
80 gripper
82 gripper arm
84 gripper arm
86 gripper recess
88 gripper recess
90 gripper cylinder
92 gripper cylinder
94 crimping jaws
96 crimping cylinder
98 crimping piston
100 link body
102 link
104 crimping lever
106 plate
108 roll
110 inclined slot
112 front plate
114 support plate
116 tension strut
118 connection bolt

The invention claimed is:

1. A crimping machine for crimping contact elements with an end portion of a conductor, the crimping machine comprising:
a storage arrangement including at least two storages respectively storing the contact elements;
a transport device configured to respectively transfer the contact elements from a transfer position to a crimping head, the transport device formed of a shuttle mounted on the transport device, the shuttle of the transport device being configured to take over each separated contact element that is in the transfer position and configured to transport each separated contact element to the crimping head, the shuttle including a first gripper and a second gripper arranged in parallel and mounted to the shuttle, the first gripper configured to grip a first contact element of the contact elements located in the transfer position and the second gripper configured to grip a second contact element of the contact elements located in the transfer position, the first contact element being configured to be crimped prior to the second contact element, which is configured to be crimped in a subsequent crimping operation;
a centering device configured to center the conductor with respect to a crimping position; and
a housing including a base plate and enclosing the at least two storages, the transport device, and the centering device, each of the at least two storages, the transport device, and the centering device being attached, directly or indirectly, to the base plate.

2. The crimping machine according to claim 1, wherein each storage of the at least two storages is assigned to a conveyor unit that is configured to convey a respective contact element to be crimped to the transfer position.

3. The crimping machine according to claim 1, wherein the shuttle is guided along a guide such that the shuttle is movable in one plane from the transfer position to the crimping position.

4. The crimping machine according to claim 1, wherein the contact elements are each arranged as a belt strap on a drum magazine.

5. The crimping machine according to claim 4, further comprising a cutting device configured to separate the respective contact element located in the transfer position from the belt strap.

6. The crimping machine according to claim 5, wherein the cutting device has a number of cutting knives corresponding to the number of storages.

7. The crimping machine according to claim 1, wherein the centering device has a plurality of centering apertures adapted to be orientated along a guide with respect to the crimping position.

8. The crimping machine according to claim 7, wherein the centering device has two centering jaws which are adapted to be moved apart for removing the crimped component.

9. The crimping machine according to claim 1, wherein:
transfer positions of a plurality of conveyor units are positioned on top of each other, and the first and second grippers of each respective conveyor unit of the plurality of conveyor units are movable between transport planes predetermined by the plurality of conveyor units, and
a cutting device is movable in parallel to an axis of the crimping head or the centering device.

10. The crimping machine according to claim 1, further comprising a cover configured to cover a crimping area and a safety circuit interrupting an energy supply and an equipment supply in a case of undesired opening of the cover, and a set-up circuit configured to check a function of the crimping machine when the cover is open.

11. The crimping machine according to claim 1, further comprising a feeding device configured to feed the conductor to the crimping position.

12. The crimping machine according to claim 1, further comprising a control unit configured to control the transport unit such that each respective contact element located in the transfer position is taken over and is movable to the crimping position.

* * * * *